United States Patent
Naba et al.

(10) Patent No.: US 11,973,003 B2
(45) Date of Patent: Apr. 30, 2024

(54) CERAMIC METAL CIRCUIT BOARD AND SEMICONDUCTOR DEVICE USING THE SAME

(71) Applicants: KABUSHIKI KAISHA TOSHIBA, Tokyo (JP); TOSHIBA MATERIALS CO., LTD., Yokohama (JP)

(72) Inventors: Takayuki Naba, Chigasaki Kanagawa (JP); Keiichi Yano, Yokohama Kanagawa (JP); Hiromasa Kato, Nagareyama Chiba (JP)

(73) Assignees: KABUSHIKI KAISHA TOSHIBA (JP); TOSHIBA MATERIALS CO., LTD. (JP)

( * ) Notice: Subject to any disclaimer, the term of this patent is extended or adjusted under 35 U.S.C. 154(b) by 0 days.

(21) Appl. No.: 18/156,499

(22) Filed: Jan. 19, 2023

(65) Prior Publication Data

US 2023/0154826 A1 May 18, 2023

Related U.S. Application Data

(63) Continuation of application No. 16/546,509, filed on Aug. 21, 2019, now Pat. No. 11,594,467, which is a (Continued)

(30) Foreign Application Priority Data

Mar. 23, 2017 (JP) ................................. 2017-057693

(51) Int. Cl.
*H01L 23/373* (2006.01)
*H05K 1/02* (2006.01)
(Continued)

(52) U.S. Cl.
CPC ....... *H01L 23/3735* (2013.01); *H05K 1/0271* (2013.01); *H05K 1/0306* (2013.01); *H05K 1/09* (2013.01); *C04B 2235/9607* (2013.01)

(58) Field of Classification Search
CPC .. H01L 23/3735; H05K 1/0271; H05K 1/306; H05K 1/09; C04B 2235/9607
(Continued)

(56) References Cited

U.S. PATENT DOCUMENTS 6,426,154 B1 * 7/2002 Naba ........................ H01L 23/13
428/629
7,256,353 B2 * 8/2007 Osanai ................ H01L 23/3735
361/720
(Continued)

FOREIGN PATENT DOCUMENTS

CN 104170075 A 11/2014
CN 105304600 A 2/2016
(Continued)

OTHER PUBLICATIONS

International Search Report for International Application No. PCT/JP2018/010256 dated Jun. 5, 2018 (3 pages).

*Primary Examiner* — Calvin Y Choi
(74) *Attorney, Agent, or Firm* — Harness, Dickey & Pierce, P.L.C.

(57) ABSTRACT

According to one embodiment, a ceramic metal circuit board is a ceramic metal circuit board formed by bonding metal circuit plates to at least one surface of a ceramic substrate. At least one of the metal circuit plates has an area of not less than 100 mm² and includes a concave portion having a depth of not less than 0.02 mm within a range of 1% to 70% of a surface of the at least one of the metal circuit plates. The concave portion is provided not less than 3 mm inside from an end of the metal circuit plate.

16 Claims, 5 Drawing Sheets

Related U.S. Application Data continuation of application No. PCT/JP2018/010256, filed on Mar. 15, 2018.

(51) Int. Cl.
  *H05K 1/03* (2006.01)
  *H05K 1/09* (2006.01)

(58) Field of Classification Search
  USPC .......................................................... 257/748
  See application file for complete search history.

(56) References Cited

U.S. PATENT DOCUMENTS

| | | | | |
|---|---|---|---|---|
| 8,745,841 | B2* | 6/2014 | Osanai | B22D 19/0072 164/112 |
| 9,095,051 | B2 | 7/2015 | Fukuda et al. | |
| 10,170,433 | B2* | 1/2019 | Soda | H01L 23/562 |
| 2014/0291699 | A1 | 10/2014 | Yano et al. | |
| 2014/0318830 | A1 | 10/2014 | Robert | |
| 2014/0347836 | A1 | 11/2014 | Nakamura et al. | |
| 2015/0380342 | A1 | 12/2015 | Kashiwazaki | |
| 2016/0093594 | A1 | 3/2016 | Funatsu et al. | |
| 2017/0141086 | A1 | 5/2017 | Funatsu et al. | |

FOREIGN PATENT DOCUMENTS

| | | |
|---|---|---|
| DE | 10337640 A1 | 3/2005 |
| JP | H08250823 A | 9/1996 |
| JP | H1084059 A | 3/1998 |
| JP | 2002083917 A | 3/2002 |
| JP | 2008-177461 A | 7/2008 |
| JP | 2012119519 A | 6/2012 |
| JP | 2014216459 A | 11/2014 |
| JP | 5669495 B2 | 2/2015 |
| JP | 2016072417 A | 5/2016 |
| JP | 2016152383 A | 8/2016 |
| JP | 2016189421 A | 11/2016 |
| WO | 2013094213 A1 | 6/2013 |
| WO | 2013136895 A1 | 9/2013 |

* cited by examiner (b)

(c)

(d)

(e)

CERAMIC METAL CIRCUIT BOARD AND SEMICONDUCTOR DEVICE USING THE SAME

CROSS-REFERENCE TO RELATED APPLICATIONS

This application is a Continuation Application of U.S. application Ser. No. 16/546,509 filed Aug. 21, 2019, which is a Continuation of PCT Application No. PCT/JP2018/010256, filed Mar. 15, 2018 and based upon and claiming the benefit of priority from Japanese Patent Application No. 2017-057693, filed Mar. 23, 2017, the entire contents of all of which are incorporated herein by reference.

FIELD

Embodiments described herein relate generally to a ceramic metal circuit board and a semiconductor device using the same.

BACKGROUND

Semiconductor elements include power elements represented by IGBT. The performance of the power elements is improved year by year. In addition, along with the improvement of the performance of the semiconductor elements, the operation guarantee temperature (junction temperature) is raised. As a ceramic metal circuit board used to mount the semiconductor element, a ceramic metal circuit board with an excellent heat resistant cycle characteristic (TCT characteristic) has been developed to cope with the rise of the operation guarantee temperature. For example, in WO 2013/094213 (patent literature 1), the TCT characteristic is improved by optimizing the side surface shape of a copper circuit board. In patent literature 1, the reliability is thus improved even if a semiconductor element whose operating temperature is 170° C. or more is mounted.

A semiconductor device in which a semiconductor element is mounted on a ceramic metal circuit board is resin-molded in many cases. The resin molding makes it possible to improve the productivity and prevent a conduction failure or degradation. For example, in Jpn. Pat. Appln. KOKAI Publication No. 2002-83917 (patent literature 2), concave portions are provided in the surface of a lead frame, thereby obtaining an anchor effect to a molding resin.

CITATION LIST

Patent Literature

Patent literature 1: WO 2013/094213
Patent literature 2: Jpn. Pat. Appln. KOKAI Publication No. 2002-83917
Patent literature 3: Jpn. Pat. Appln. KOKAI Publication No. 8-250823
Patent literature 4: Jpn. Pat. Appln. KOKAI Publication No. 2012-119519

DETAILED DESCRIPTION

Figure 1:
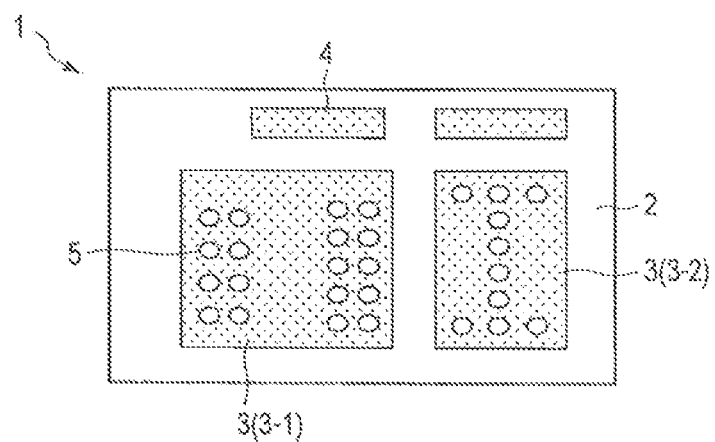
FIG. 1 is a top view showing an example of a ceramic metal circuit board according to an embodiment.

In patent literature 2, fine concave portions are provided on the lead frame. With the fine concave portions, the adhesion to the resin molding is improved. For example, in FIG. 6 of patent literature 2, a semiconductor element is mounted on the lead frame. A semiconductor device of patent literature 2 does not use a ceramic substrate. In the device that does not use a ceramic substrate, when the operating temperature of the semiconductor element becomes high, the durability is insufficient. In addition, the thermal expansion of a metal circuit board caused by the rise of the operating temperature of the semiconductor element becomes large, and the adhesion to the molding resin is insufficient in the fine concave portions.

On the other hand, patent literature 3 discloses a ceramic circuit board including a ceramic substrate and a metal plate bonded to at least the surface of the ceramic substrate, in which a plurality of holes are formed inside the outer peripheral edge portion of the metal plate on the surface side opposite to the bonding surface to the ceramic substrate. In patent literature 3, the purpose of providing the plurality of holes inside the outer peripheral edge portion of the metal plate is to release stress to the outer peripheral end of the metal plate.

Patent literature 4 discloses providing, within the range of 0.3 mm to 2.0 mm from the semiconductor mounting region end of a copper circuit, a thin portion whose thickness d is 20% to 60% of a total thickness D of the copper circuit and a brazing material, thereby preventing cracks due to thermal shock from being generated in a solder layer and a ceramic substrate. Additionally, patent literature 4 describes that if the thin portion is provided in a range more than 2.0 mm from the semiconductor mounting region end, cracks are generated in the thermal shock test.

The present invention has been made in order to solve such problems, and provides a ceramic metal circuit board with excellent adhesion to a molding resin, and a semiconductor device.

According to one embodiment, a ceramic metal circuit board formed by bonding metal circuit plates to at least one surface of a ceramic substrate, wherein at least one of the metal circuit plates has an area of not less than 100 mm$^2$ and includes a concave portion having a depth of not less than 0.02 mm within a range of 1% to 70% of a surface of the at least one of the metal circuit plates.

A ceramic metal circuit board according to an embodiment is a ceramic metal circuit board formed by bonding metal circuit plates to at least one surface of a ceramic substrate, wherein at least one of the metal circuit plates has an area of not less than 100 mm$^2$ and includes concave portions having a depth of not less than 0.02 mm within a range of 1% to 70% of a surface of the at least one of the metal circuit plates, and the concave portions are formed not less than 3 mm inside from an end of the metal circuit plate as well. The concave portions may be formed only 3 mm or more inside from the end of the major surface of the metal circuit plate. The concave portion may be formed both 3 mm or more inside from the end of the major surface of the metal circuit plate and in a portion less than 3 mm from the end.

FIG. 1 shows an example of the ceramic metal circuit board according to the embodiment. FIG. 1 is a top view of a metal circuit plate including concave portions viewed from the upper side. In FIG. 1, reference numeral 1 denotes a ceramic metal circuit board; 2, a ceramic substrate; 3, metal circuit plates provided with concave portions; 3-1, a first metal circuit plate including concave portion; 3-2, a second metal circuit plate including concave portions; 4, a metal circuit plate (a metal circuit plate without concave portions); and 5, concave portions.

A plurality of metal circuit plates are bonded to at least one surface of the ceramic substrate. The metal circuit plates may be provided on only one surface of the ceramic substrate, or may be provided on both surfaces. If the metal circuit plates are provided on only one surface, a back metal plate serving as a heat dissipation plate may be bonded to the opposite side. The metal circuit plates are preferably made of one of copper, a copper alloy, aluminum, and an aluminum alloy.

Figure 2:
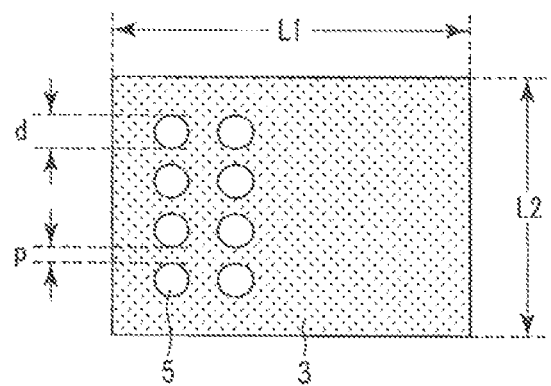
FIG. 2 is a top view showing an example of a metal circuit plate including concave portions.

At least one of the plurality of metal circuit plates is a metal circuit plate having an area of 100 mm$^2$ or more. FIG. 2 shows an example of the metal circuit plate including the concave portions. FIG. 2 is a top view of the metal circuit plate 3 including the concave portions. In FIG. 2, reference numeral 3 denotes the metal circuit plate including the concave portions; and 5, the concave portions. Reference symbol d denotes a minimum diameter of the concave portion; p, a shortest distance between the concave portions; L1, a length of a long side of the metal circuit plate; and L2, a length of a short side of the metal circuit plate.

The area of the metal circuit plate is obtained by (length L1 of long side)×(length L2 of short side). If the metal plate has a shape other than an oblong shape, the area of the surface is obtained. Various shapes such as an L shape, an H shape, an S shape, and a circular shape other than an oblong shape are usable.

In addition, at least one of the metal circuit plates each having an area of 100 mm$^2$ or more is provided with the concave portion. In the metal circuit plate provided with the concave portion, the concave portion is provided within the range of 1% to 70% of the surface of the metal circuit plate. Additionally, the depth of the concave portions is 0.02 mm or more. In addition, the concave portion is formed 3 mm or more inside from the end of the metal circuit plate as well. That is, the concave portion is provided not only at the end of the metal circuit plate having an area of 100 mm$^2$ or more but also inside. When such concave portions are provided in a large circuit plate for which the area of the metal circuit plate is 100 mm$^2$ or more, the anchor effect to a molding resin improves. For this reason, even if the operating temperature of the semiconductor element becomes high, troubles such as peeling of the molding resin can be reduced. In addition, the concave portion formation area is counted on the surface of one metal circuit plate. At least some of the concave portions need only be provided 3 mm or more inside from the end. In other words, all concave portions may be provided 3 mm or more inside from the end of the metal circuit plate, or some of them may be provided within the range less than 3 mm from the end. The area of the major surface of the metal circuit plate on which a semiconductor element or a terminal is mounted is normally 100 mm$^2$ or more. However, as the operating temperature rises, the thermal effect on the edge of the semiconductor element or the terminal increases. For this reason, the molding resin near the edge of the semiconductor element or the terminal tends to readily peel. When at least some of the concave portions are formed 3 mm or more inside from the end, peeling of the molding resin near the edge of the semiconductor element or the terminal is suppressed. It is therefore possible to suppress peeling of the molding resin throughout the metal circuit plate.

If the concave portion formation area is less than 1%, the anchor effect to the molding resin is insufficient. In addition, if the concave portion formation area is more than 70%, the area to mount the semiconductor element is short. For this reason, the area to provide the concave portion needs to fall within the range of 3% to 70% of the metal circuit plate having an area of 100 mm$^2$ or more. In addition, the area where the concave portion is provided preferably falls within the range of 30% to 70% of the surface of one metal circuit plate. Furthermore, after the semiconductor element or the terminal is mounted, a structure is preferably formed in which the concave portion is provided within the range of 30% to 95% of a semiconductor element non-mounting region other than both of a semiconductor element mounting portion and a terminal mounting portion. Hence, in the ceramic metal circuit board before the semiconductor element or the terminal is mounted, a structure is preferably formed in which the concave portion is provided within the range of 30% to 95% of the non-mounting region other than both of the region for the semiconductor element mounting portion and the region for the terminal mounting portion on the major surface of the metal circuit plate.

Figure 9:
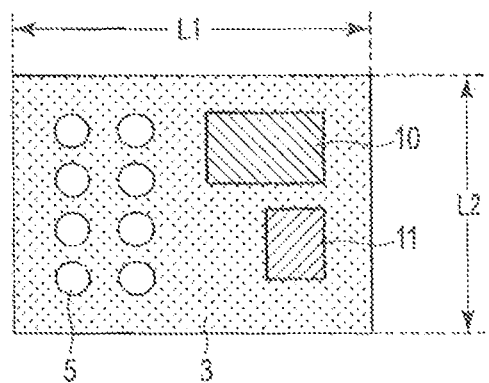
FIG. 9 is a top view showing still another example of the metal circuit plate including the concave portions.

FIG. 9 is a top view showing still another example of the metal circuit plate provided with the concave portions. In FIG. 9, reference numeral 3 denotes the metal circuit plate including the concave portions; 5, the concave portions; 10, a semiconductor element mounting portion; and 11, a terminal mounting portion.

The areas of the semiconductor element mounting portion 10 and the terminal mounting portion 11 can be obtained by observing the semiconductor device in which the semiconductor element and the like are mounted. The obtained areas are the areas of both of the region for the semiconductor element mounting portion and the region for the terminal mounting portion. If a solder layer (or a brazing material layer) used to mount the semiconductor element protrudes, the protruding solder layer is included in the semiconductor element mounting portion 11. For the terminal as well, if the solder layer or brazing material layer protrudes, it is included in the terminal mounting portion 10. This is because if the concave portions are filled with the solder layer or brazing material layer, the adhesion to the molding resin to be described later cannot be improved.

In addition, since the concave portion is provided in the metal circuit plate whose area is 100 mm² or more, the area to mount the semiconductor element or the terminal can sufficiently be ensured. In an extremely small metal circuit plate or a long metal circuit plate, the area to mount the semiconductor element cannot be ensured. In other words, it is suitable for a ceramic metal circuit board provided with a metal circuit plate having an area of 100 mm² or more.

For the ceramic metal circuit board before the semiconductor element or the terminal is mounted, a method of obtaining the area ratio of the concave portion using an engineering drawing is effective.

Additionally, for the ceramic metal circuit board after the semiconductor element or the terminal is mounted, and the semiconductor device including the metal circuit board, an upper surface photo is measured by an optical microscope. A method of obtaining the area ratio of the concave portion from the upper surface photo is effective.

For the resin-molded semiconductor device, a method using X-rays or a method of measuring after removing the resin is effective. As the method using X-rays, X-ray CT observation is usable. The area ratio of the concave portion can be obtained using an image of X-ray CT observation. When a 3D image is used, the depth of the concave portion can be measured together.

As the method of removing the resin, laser processing, chemical liquid processing, or grinding processing can be used. Laser processing is a method of melting and removing the resin by a laser beam. This method is also called laser decapsulation. Chemical liquid processing is a method of dissolving the resin by a chemical liquid. In addition, grinding processing is a method of grinding the resin. A method of grinding a predetermined amount and then performing laser processing or chemical liquid processing is also effective. After the resin is removed, it is effective to obtain the area ratio of the concave portion by observing with an optical microscope.

In addition, the depth of the concave portion is 0.02 mm or more. If the depth of the concave portion is less than 0.02 mm, the anchor effect to a molding resin is insufficient. The depth of the concave portion preferably falls within the range of 10% to 90% of the thickness of the metal circuit plate. Some of the concave portions may be of a penetration type. That is, both penetration-type concave portion and non-penetration-type concave portion may be provided in the metal circuit plate.

Figure 3A:
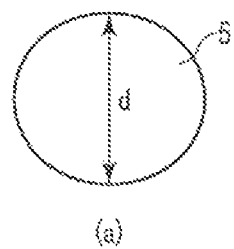
FIG. 3a is a top view showing an example of the concave portion.
Figure 3B:
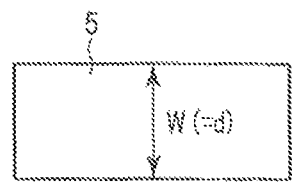
FIG. 3b is a top view showing another example of the concave portion.

In addition, the average minimum diameter d (mm) of the concave portions viewed from the upper side in a case in which each concave portion has a circular shape or an average minimum groove width W (mm) of the concave portions viewed from the upper side in a case in which the concave portions are formed as continuous grooves preferably falls within the range of 0.5 mm to 2 mm. FIGS. 3a and 3b are top views of a concave portion. (a) of FIG. 3a shows a circular shape, and (b) of FIG. 3b shows a rectangular shape. The shape of the concave portion is not limited to these, and various shapes such as an elliptical shape, an oblong shape, a polygonal shape, a star shape, and a wavy shape can be applied. In the top views of the concave portion, the shortest diagonal line is defined as the minimum diameter d, and the minimum groove width W is also expressed as d.

In addition, the measurement method of the average minimum diameter d or the average minimum groove width W includes capturing the metal circuit plate including the concave portions from above by an optical microscope. In one metal circuit plate, the minimum diameter d of each concave portion is measured. The result is rounded off to one decimal place, thereby obtaining the minimum diameter d of the concave portion. The minimum diameters d of all concave portions in one metal circuit plate are measured. Values except the minimum value and the maximum value of the individual minimum diameters d are averaged, thereby obtaining the average minimum diameter d. The average minimum groove width W is also obtained by the same method.

In addition, if the average minimum diameter d (or the average minimum width W) is less than 0.5 mm, the inlet of the concave portion is too small, and it may be impossible to sufficiently cause the molding resin to enter. Furthermore, if the average minimum diameter d (or the average minimum width W) exceeds 2 mm, the molding resin may readily disengage. For this reason, to obtain the anchor effect to the molding resin, the average minimum diameter d (or the average minimum width W) of the concave portions preferably falls within the range of 0.5 mm to 2 mm. Within this range, the minimum diameters d (or the minimum widths W) of the individual concave portions may be equal or may be different. In addition, the shapes may also be unified, or different shapes may be combined. Furthermore, all the minimum diameters d preferably fall within the range of 0.5 mm to 2 mm. Similarly, all the minimum widths W preferably fall within the range of 0.5 mm to 2 mm.

In addition, the average shortest distance p between the concave portions is preferably d/2 (mm) or more. The shortest distance p between the concave portions indicates the shortest of the distances between one concave portion and concave portions around it. The shortest distance p between the concave portions is also called the pitch of the concave portions. If the average shortest distance p is less than d/2, the strength between the pitches between the concave portions may be insufficient. For example, if the strength between the pitches is short in a case in which the metal circuit plate is as thick as 0.3 mm or more or 0.8 mm or more, the adhesion to the molding resin may lower. For the minimum width W as well, the average shortest distance p between the concave portions is preferably W/2 (mm) or more. In addition, all the shortest distances p between the concave portions preferably satisfy d/2 (mm) or more or W/2 (mm) or more.

The measurement method of the average shortest distance p will be described here. The metal circuit plates including the concave portions are captured from above by an optical microscope. In one metal circuit plate, the shortest distance p between the concave portions is measured. The result is rounded off to one decimal place, thereby obtaining the shortest distance p between the concave portions. The shortest distances p of all the concave portions in one metal circuit plate are measured. Values except the minimum value and the maximum value of the individual shortest distances p are averaged, thereby obtaining the average shortest distance p.

Figure 4A:
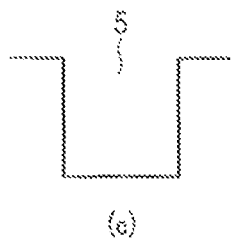
FIG. 4a is a sectional view showing an example of the concave portion.
Figure 4B:
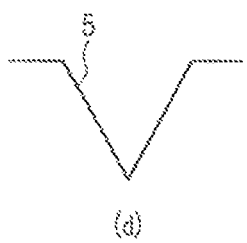
FIG. 4b is a sectional view showing another example of the concave portion.
Figure 4C:
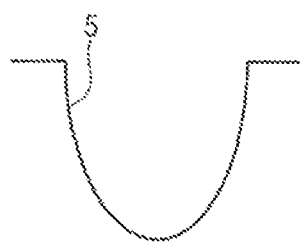
FIG. 4c is a sectional view showing still another example of the concave portion.
Figure 4D:
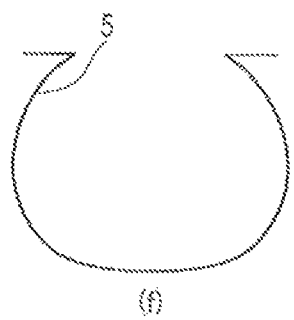
FIG. 4d is a sectional view showing still another example of the concave portion.
Figure 4E:
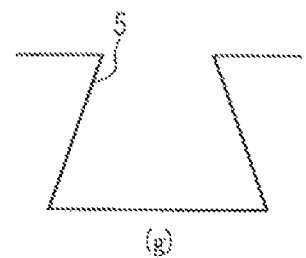
FIG. 4e is a sectional view showing still another example of the concave portion.
Figure 4F:
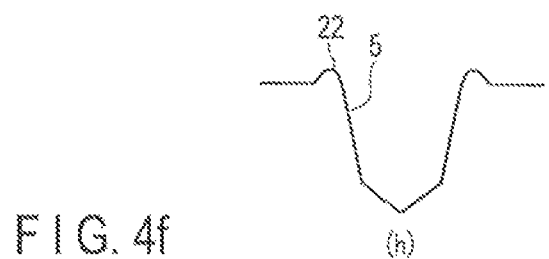
FIG. 4f is a sectional view showing still another example of the concave portion.

In addition, the sectional shape of the concave portion is preferably one shape selected from a U shape, a V shape, an oblong shape, and a circular shape. FIGS. 4a, 4b, 4c, 4d, 4e, and 4f show examples of the concave portion. (c) of FIG. 4a shows a concave portion whose sectional shape is an oblong shape. (d) of FIG. 4b shows a concave portion whose sectional shape is a V shape. (e) of FIG. 4c shows a concave portion whose sectional shape is a U shape. (f) of FIG. 4d shows a concave portion whose sectional shape is a circular shape. (g) of FIG. 4e shows a concave portion whose sectional shape is s triangular shape. (h) of FIG. 4f shows a shape with a convex portion 22 formed at the end (inlet edge) of the concave portion 5.

Of these shapes, the circular shape shown in (f) of FIG. 4d or the triangular shape shown in (g) of FIG. 4e readily improves the bonding strength to the molding resin. In the concave portion having the circular shape or the triangular shape, the interior is wider than the inlet of the concave portion. With this structure, the molding resin hardly disengages after solidifying. The oblong shape, the V shape, and the U shape are structures capable of readily forming a concave portion. Hence, when mass production is taken into consideration, the oblong shape, the V shape, and the U shape are more preferable. The sectional shapes of the concave portion may be unified in one metal circuit plate, or may be different. Additionally, as shown in (h) of FIG. 4f, a shape with the convex portion 22 formed at the opening end edge that is the end of the concave portion 5 may be used. When the convex portion 22 is formed at the end of the concave portion 5, the molding resin can be prevented from being shifted. The concave portion with the convex portion at the opening end edge can be formed by, for example, applying laser machining to the metal circuit plate.

The sectional shape of the concave portion is not limited to those shown in FIGS. 4a, 4b, 4c, 4d, 4e, and 4f. A screw groove shape or the like is also usable.

Figure 5:
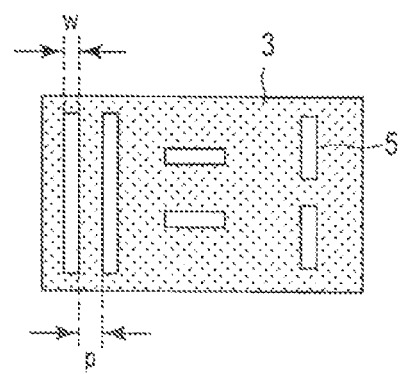
FIG. 5 is a top view showing another example of the metal circuit plate including the concave portions.

In addition, the shape of the concave portion may be a groove shape. FIG. 5 shows an example of a metal circuit plate including concave portions with a groove shape. In FIG. 5, reference numeral 3 denotes the metal circuit plate including the concave portions; and 5, the concave portions. Reference symbol w denotes a minimum width of the concave portion; and p, the shortest distance between the concave portions. In FIG. 5, each concave portion has an oblong shape when viewed from the upper side. The concave portion with the groove shape need not always have the oblong shape, and may have a curved shape such as an S shape or an M shape. In addition, as the sectional shape, the shapes shown in FIGS. 4a, 4b, 4c, 4d, 4e, and 4f are applicable. The concave portion may combine the circular shape and the groove shape.

Figure 6:
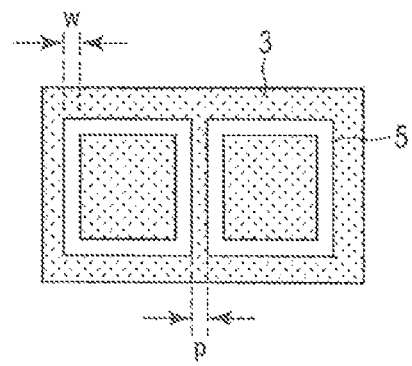
FIG. 6 is a top view showing still another example of the metal circuit plate including the concave portions.

In addition, the concave portion may have a continuous groove shape. FIG. 6 shows a top view of a metal circuit plate including concave portions with a continuous groove shape. In FIG. 6, reference numeral 3 denotes the metal circuit plate including the concave portions; and 5, the concave portions. Reference symbol w denotes the minimum width of the concave portion; and p, the shortest distance between the concave portions. FIG. 6 shows concave portions each having a groove shape, and the concave portions are communicated with each other and are continuing in a rectangular shape. As described above, the continuous groove shape indicates a shape formed by connecting concave portions. The continuous groove shape is not limited to the rectangular shape, and various shapes such as a polygonal shape, a circular shape, and an elliptical shape can be used. In addition, the shape can be combined with the shapes shown in FIGS. 3a and 3b or FIGS. 4a, 4b, 4c, 4d, 4e, and 4f as described above.

Figure 10:
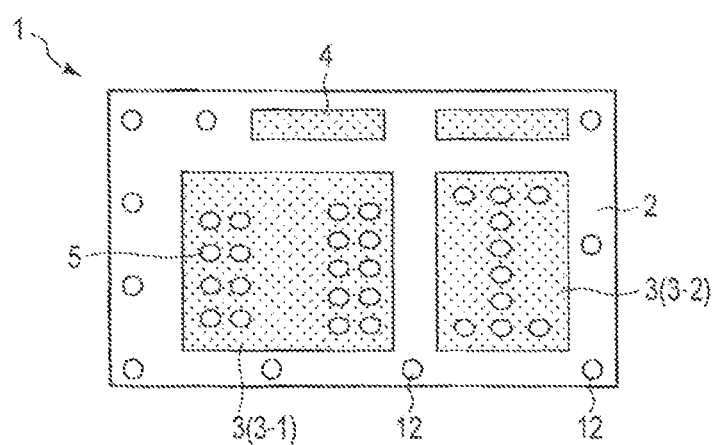
FIG. 10 is a top view showing another example of the ceramic metal circuit board according to the embodiment.

In addition, it is preferable that there is at least one portion where two or more concave portions 5 or two or more lines of concave portions 5 are arranged outward from the center of the metal circuit plate 3 including the concave portions 5. When the concave portions are provided outward from the center (inside), the molding resin can be prevented from being shifted. Examples of the metal circuit plate having the above-described arrangement are shown in FIGS. 1, 2, 5, 9, and 10. For example, as shown in FIG. 1 or 10, a portion where three or more concave portions or three or more lines of concave portions are arranged preferably exists. Here, the center of the metal circuit plate including the concave portions is the intersection of two diagonal lines of a circumscribed oblong of the target metal circuit plate.

In addition, the thickness of the metal circuit plate is preferably 0.3 mm or more. Furthermore, the thickness of the metal circuit plate is preferably 0.8 mm or more. When the metal circuit plate is made thick, the heat dissipation properties of the ceramic metal circuit board can be improved. This is effective in a ceramic metal circuit board in which a semiconductor element with a high operating temperature is mounted.

In addition, the surface size of the ceramic substrate is preferably 12 cm$^2$ or more. If the ceramic substrate has an oblong shape, the surface size of the ceramic substrate is obtained by long side×short side. If the ceramic substrate does not have an oblong shape, the surface size is obtained by the area of the surface to which the metal circuit plate is bonded. If the ceramic substrate includes a hole for screwing, it is not counted in the surface size.

If the surface size of the ceramic substrate is 12 cm$^2$ (1,200 mm$^2$) or more, the structure is readily be provided with a plurality of metal circuit plates. In addition, two or more metal circuit plates each having an area of 100 mm$^2$ or more are readily provided. When two or more metal circuit plates with concave portions are provided, the adhesion to the molding resin can be made firmer.

Note that the upper limit of the surface size of the ceramic substrate is not particular limited. However, the surface size is preferably 100 cm$^2$ or less. If the surface size is more than 100 cm$^2$, resin molding may be difficult. For example, in transfer molding, the ceramic metal circuit board is arranged in a mold, and resin molding is performed for it. If the ceramic metal circuit board is too large, it may be difficult to arrange the ceramic metal circuit board in the mold because of, for example, an increase in a warp amount of the ceramic metal circuit board at the early stage or during molding. For this reason, the surface size of the ceramic substrate is preferably 12 cm$^2$ to 100 cm$^2$, and more preferably 20 cm$^2$ to 50 cm$^2$. In addition, the ceramic substrate 2 may be a single plate, or may have a three-dimensional structure such as a multilayered structure.

In addition, the ceramic substrate is preferably a silicon nitride substrate. As the ceramic substrate, any of an aluminum nitride substrate, an alumina substrate, an alumina-zirconia substrate, and a silicon nitride substrate can be applied.

In an aluminum nitride substrate and alumina substrate for general purpose use, the three-point flexural strength is about 300 MPa to 450 MPa. The alumina-zirconia substrate is a sintered body in which aluminum oxide and zirconium oxide are mixed. The strength of the alumina-zirconia substrate is also about 550 MPa. With a strength of 550 MPa or less, if the substrate thickness is 0.4 mm or less, the possibility that the substrate breaks in molding becomes high, or the TCT (heat cycle) characteristic for a semiconductor device lowers. In particular, the durability lowers when the high temperature side of the TCT test is raised to 175° C. or more.

In the silicon nitride substrate, the three-point flexural strength can be made as high as 600 MPa or more, or 700 MPa or more. There are silicon nitride substrates having a thermal conductivity of 50 W/m·K or more, or 80 W/m·K or more. In particular, some silicon nitride substrates recently have both a high strength and a high thermal conductivity.

In a silicon nitride substrate having a three-point flexural strength of 600 MPa or more and a thermal conductivity of 80 W/m·K or more, the substrate thickness can be decreased to 0.30 mm or less. In particular, when the substrate size is 12 cm$^2$ or more, or 20 cm$^2$ or more, the substrate is preferably a silicon nitride substrate.

Note that the three-point flexural strength is measured by a method conforming to JIS-R-1601, and the thermal conductivity is measured by a laser flash method conforming to JIS-R-1611.

In addition, the bonding method for the ceramic substrate and the metal circuit plate is not particular limited, and an active metal method, a direct bonding method, or the like is usable.

Figure 7:
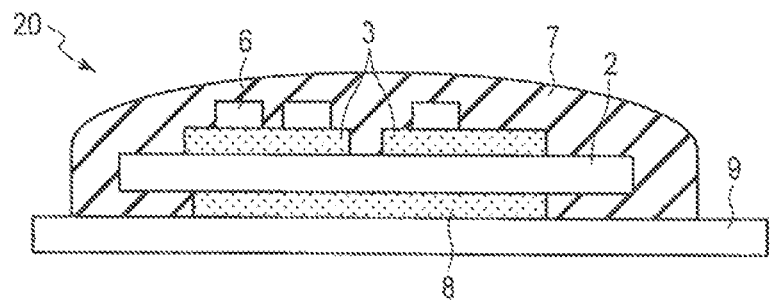
FIG. 7 is a sectional view showing an example of a semiconductor device according to the embodiment.

Furthermore, as shown in FIG. 7, the structure may include a back metal plate 8 provided on the back surface of the ceramic substrate 2 with respect to the surface with the metal circuit plates 3. The back metal plate 8 can be used as a heat dissipation late or a circuit plate. Alternatively, the structure may include concave portions provided in the back metal plate 8. This is effective when resin-molding the back surface (the surface provided with the back metal plate 8). Additionally, a grease layer is used when bonding a mounting substrate 9 and the back metal plate 8, as will be described later. The adhesion to the grease layer can be improved by providing the concave portions in the back metal plate 8.

In addition, of the surfaces (both major surfaces) of the ceramic substrate, at least a part of a portion where no metal circuit plate is provided may be provided with the concave portions. Note that in a case in which the back metal plate is provided, of the surfaces (both major surfaces) of the ceramic substrate, at least a part of a surface on which no metal circuit plate is provided may be provided with the concave portions. FIG. 10 shows an example in which the ceramic substrate is provided with the concave portions. In FIG. 10, reference numeral 1 denotes the ceramic metal circuit board; 2, the ceramic substrate; 3, the metal circuit plates provided with the concave portions; 4, a metal circuit plate without concave portions; 5, the concave portions; and 12, concave portions provide in the ceramic substrate. The first metal circuit plate 3-1 and the second metal circuit plate 3-2 are provided on one major surface of the ceramic substrate 2. In the first metal circuit plate 3-1, concave portions arranged in two lines outward from the center are formed. On the other hand, in the second metal circuit plate 3-2, concave portions arranged in three lines outward from the center are formed.

FIG. 10 shows the surface provided with the metal circuit plates. The concave portions 12 are formed at an end of the ceramic substrate 2 in portions of the ceramic substrate 2 where the metal circuit plates that includes both of the metal circuit plate 3 provided with the concave portions and the metal circuit plate 4 that is not provided with the concave portions are not provided. When the concave portion 12 is formed in the ceramic substrate 2, the adhesion to the molding resin can further be improved.

In addition, to avoid lowering of the insulating properties of the ceramic substrate 2 caused by the concave portions, the concave portions 12 are preferably non-penetration-type concave portions. In addition, the concave portions 12 are preferably provided within the range of 30% to 95% of the surface area of the ceramic substrate 2 that is in direct contact with the molding resin. The minimum diameter d or the minimum width W of the concave portion preferably falls within the range of 0.5 mm to 2 mm.

The ceramic metal circuit board as described above is suitable for a semiconductor device including a semiconductor element. The semiconductor element is preferably mounted on the metal circuit plate provided with the concave portion. In addition, a plurality of semiconductor elements are preferably mounted on the metal circuit plate provided with the concave portion. Furthermore, the ceramic metal circuit board is suitable for a resin-molded semiconductor device.

FIG. 7 shows an example of a resin-molded semiconductor device. In FIG. 7, reference numeral 2 denotes the ceramic substrate; 3, the metal circuit plates provided with the concave portions; 6, semiconductor elements; 7, a molding resin; 8, the metal plate; 9, the mounting substrate; and 20, a semiconductor device.

In FIG. 7, two metal circuit plates provided with the concave portions are bonded. Two semiconductor elements are mounted on one of the metal circuit plates, and one semiconductor element is mounted on the other. The semiconductor device according to the embodiment is not limited to such a structure, and one semiconductor element or two or more semiconductor elements can be mounted on the metal circuit plate provided with the concave portions.

The metal circuit plate provided with the concave portion is a large metal plate having an area of 100 mm$^2$ or more. For this reason, two or more semiconductor elements can be mounted. On the other hand, each semiconductor element serves as a heat generation source. When resin molding is performed, the resin near the semiconductor element readily peels due to thermal stress. Hence, when the concave portion is provided, the resin is difficult to peel.

In particular, this is effective for a semiconductor element having an operating temperature of 170° C. or more. The operating temperature is a so-called junction temperature. Even if the heat generation amount of the semiconductor element increases, peeling of the resin can be suppressed by providing the concave portion. For electrical conductivity of the semiconductor element, wire bonding or a lead frame is used. If resin peeling occurs, wire bonding readily breaks. In addition, the lead frame is formed by a metal plate such as a copper plate or an aluminum plate. The metal plate readily thermally expands, and this easily leads to peeling of the molding resin. Hence, it is effective to prevent peeling of the resin by providing the concave portion.

Figure 8:
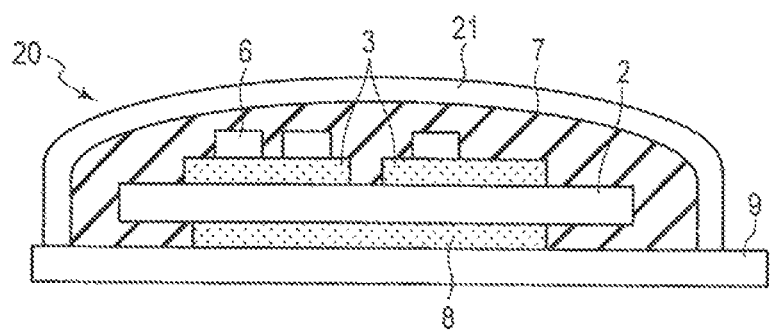
FIG. 8 is a sectional view showing another example of the semiconductor device according to the embodiment.

The semiconductor device shown in FIG. 7 does not include a case. The semiconductor device is not limited to such a semiconductor device, and a semiconductor device including a case is also incorporated in this embodiment. FIG. 8 shows an example. The plurality of metal circuit plates 3 provided with the concave portions are provided at an interval on one major surface of the ceramic substrate 2 of the semiconductor device 20. The semiconductor element 6 is mounted on the major surface of each metal circuit plate 3. The number of elements mounted may be different for each the metal circuit plate 3. The metal plate 8 is provided on the other major surface of the ceramic substrate 2. The metal plate 8 of the ceramic substrate 2 having such a structure is bonded to the mounting substrate 9. A case 21 has a dome shape, and its opening end is bonded to the surface of the mounting substrate 9. The molding resin 7 fills the space surrounded by the mounting substrate 9 and the case 21. The molding resin 7 is formed by, for example, a molding method using a potting gel. In this case, the case 21 also serves as a mold. In addition, the case 21 may be divided into a lid and a side wall.

Additionally, in the ceramic metal circuit board according to the embodiment, the surface size of the ceramic substrate can be as large as 12 cm² or more, or 20 cm² or more. For this reason, a number of semiconductor elements can be mounted. Since peeling of the molding resin is suppressed, the reliability of the semiconductor device in which a number of semiconductor elements are mounted can be improved.

A method of manufacturing the ceramic metal circuit board according to the embodiment will be described next. If the ceramic metal circuit board according to the embodiment has the above-described structure, the manufacturing method is not particularly limited. The following method can be used for the manufacture with a high yield.

First, a ceramic substrate is prepared. As the ceramic substrate, various substrates such as a silicon nitride substrate, an aluminum nitride substrate, an alumina substrate, and an alumina-zirconia substrate can be applied. The ceramic substrate preferably has a thickness of 1 mm or less. If the three-point flexural strength is 600 MPa or more, the thickness is preferably 0.4 mm or less. As a substrate having a high strength, a silicon nitride substrate can be used. The silicon nitride substrate preferably has a three-point flexural strength of 600 MPa or more and a thermal conductivity of 50 W/m·K or more.

A step of providing concave portion in the ceramic substrate is performed as needed. As the step of providing concave portion in the ceramic substrate, shot blasting, laser machining, drilling, or the like can be performed. The step of providing concave portion in the ceramic substrate may be performed after metal plates are bonded.

Next, metal circuit plates are bonded. As a metal circuit plate, a copper plate, a copper alloy plate, an aluminum plate, an aluminum alloy plate, or the like can be used. The metal circuit plate preferably has a thickness of 0.3 mm or more, or 0.8 mm or more.

In addition, as the bonding method, an active metal bonding method or a direct bonding method can be used. The active metal bonding method uses a bonding brazing material containing one material or two or more materials selected from the group consisting of Ti, Zr, Hf, and Si. The active metal bonding method can be applied to both an oxide-based ceramic substrate and a nitride-based ceramic substrate.

When one material selected from the group consisting of Ti, Zr, and Hf is used, a brazing material containing silver (Ag) and/or copper (Cu) is preferable. In addition, indium (In) or tin (Sn) is added as needed. Such a bonding brazing material is suitable for bonding of a copper plate.

When Si is used, a brazing material containing aluminum (Al) is preferable. Such a bonding brazing material is suitable for bonding of an Al plate.

The direct bonding method is a method of bonding without using a bonding brazing material. This is a method suitable for bonding of a copper plate and an oxide-based ceramic substrate. Since no bonding brazing material is used, the cost can be reduced.

In addition, the metal circuit plate to be bonded may be patterned in advance, or may be a solid plate. If a solid plate is bonded, it is patterned by an etching process. In addition, a back metal plate is bonded as needed.

In addition, if the metal plate is as thick as 0.3 mm or more or 0.8 mm or more, etching processing may be performed to form a tilting structure on a side surface of the metal plate. When the metal plate side surface has a tilting structure, the thermal stress on the bonding end between the metal plate and the ceramic substrate can be reduced, and therefore, the TCT characteristic improves.

Next, a step of providing concave portion in the metal circuit plate is performed. The metal circuit plate to provide the concave portion has an area of 100 mm² or more. As the step of providing the concave portion, one of laser machining, drilling, honing, and etching can be performed.

In the laser machining, the laser machining is performed for a portion where concave portion should be provided. The minimum diameter or the depth of the concave portion can be adjusted by controlling the output or the spot diameter of a laser beam.

In the drilling, the minimum diameter of the concave portion can be adjusted by controlling the diameter of a drill. Additionally, as the shape of the drill, various shapes such as a screw groove shape and a needle shape can be used. Furthermore, the concave portion depth can be adjusted by the sticking depth of the drill.

In the honing, a mask is attached to the portion where no concave portions are provided. The honing is performed for portions where the mask is not attached. The honing is effective to form a concave portion with a small depth.

In the etching, an etching resist is provided on the portion where no concave portions are provided. The etching is performed for portions where the resist is not provided. The minimum diameter of the concave portion can be controlled by the application shape of the etching resist. In addition, the concave portion depth can be adjusted by controlling the etching time. Additionally, the concave portion 5 whose section has a circular shape as shown in (f) of FIG. 4d can be formed by the etching. The etching that does not form a through hole is called half etching.

In addition, the portions to provide the concave portion can be provided within the range of 1% to 70% of the metal circuit plate surface with an area of 100 mm² or more. The depth of the concave portion can be 0.02 mm or more. The area to provide the concave portion preferably falls within the range of 30% to 95% of one metal circuit plate surface other than a semiconductor element mounting portion region and a terminal mounting portion region.

After the concave portion formation, the mask or the etching resist is removed.

Next, a step of mounting semiconductor elements is performed. The semiconductor elements are provided on the metal circuit plates with the concave portions. Mounting of the semiconductor elements is performed via a bonding layer such as solder or a brazing material. Two or more semiconductor elements may be provided on a metal circuit plate with the concave portions. In addition, when providing the two or more semiconductor elements, they may be identical elements or may be different elements.

Next, a step of attaining electrical conductivity of the semiconductor elements is performed. Wire bonding or a lead frame is provided. In addition, a semiconductor device (a ceramic circuit board on which the semiconductor elements are mounted) is mounted on a mounting substrate. In the mounting step of the semiconductor device on the mounting substrate, solder, an adhesive, screwing, or the like is used.

Next, a resin molding step is performed. As the resin used in the molding step, an epoxy resin or the like can be used. In addition, various methods such as a transfer method and a compression method are applied as the molding step. A molding method using a potting gel is also usable. In recent years, the transfer method is used because of its high mass productivity. The transfer molding is a method of heating and softening a resin in a plunger, pouring the resin into a mold, and curing. Since the softened resin is used, gaps in the semiconductor device with a complex shape can easily be filled with the resin. In particular, the interior of each concave portion of the metal circuit plates can easily be filled with the resin. In addition, the mass productivity/productivity is excellent because the molding resin is solidified at once. In the potting step, the case of the module may directly be used.

Note that the order of the mounting step of the semiconductor device on the mounting substrate and the resin molding step may be reversed.

EXAMPLES

Examples 1 to 13 and Comparative Examples 1 and 2

Ceramic substrates shown in Table 1 were prepared as ceramic substrates.

TABLE 1

|  | Material | Thermal conductivity (W/m · K) | Three-point flexural strength (MPa) | Substrate size Long side(mm) × short side(mm) × thickness (mm) |
|---|---|---|---|---|
| Ceramic substrate 1 | Silicon nitride | 90 | 650 | 60 × 50 × 0.32 |
| Ceramic substrate 2 | Silicon nitride | 80 | 750 | 48 × 27 × 0.25 |
| Ceramic substrate 3 | Silicon nitride | 85 | 700 | 48 × 27 × 0.20 |
| Ceramic substrate 4 | Alumina-zirconia | 40 | 550 | 37 × 27 × 0.32 |
| Ceramic substrate 5 | AlN | 170 | 400 | 37 × 27 × 0.635 |

Next, metal plates were bonded to the ceramic substrates shown in Table 1 using an active metal method. If a metal plate is a copper plate, bonding was performed using an Ag—Cu—Sn—Ti-based brazing material. If a metal circuit plate is an Al plate, bonding was performed using an Al—Si-based brazing material. Each main metal plate was etched to form a circuit pattern shown in Table 2. With this step, a ceramic metal circuit board was formed. The results are shown in Table 2.

TABLE 2

|  |  | Main metal plate | | | Back metal plate | |
|---|---|---|---|---|---|---|
|  | Ceramic substrate | Material | Size: long side (mm) × short side (mm) × thickness (mm) | | Material | Size: long side (mm) × short side (mm) × thickness (mm) |
| Ceramic metal circuit board 1 | Ceramic substrate 1 | Cu | One metal plate having size of 55 × 20 × 0.8 Two metal plates each having size of 55 × 10 × 0.8 | | Cu | 55 × 45 × 0.8 |
| Ceramic metal circuit board 2 | Ceramic substrate 1 | Al | One metal plate having size of 45 × 30 × 0.6 Three metal plates each having size of 22 × 13 × 0.6 | | Al | 55 × 45 × 0.5 |
| Ceramic metal circuit board 3 | Ceramic substrate 2 | Cu | Two metal plates each having size of 24 × 16 × 0.8 Three metal plates each having size of 10 × 7 × 0.8 | | Cu | 45 × 24 × 0.7 |
| Ceramic metal circuit board 4 | Ceramic substrate 3 | Cu | Two metal plates each having size of 24 × 16 × 0.8 One metal plate having size of 10 × 24 × 0.8 | | Cu | 45 × 24 × 0.7 |
| Ceramic metal circuit board 5 | Ceramic substrate 4 | Cu | One metal plate having size of 33 × 15 × 0.5 Four metal plates each having size of 7 × 7.5 × 0.5 | | Cu | 35 × 25 × 0.5 |
| Ceramic metal circuit board 6 | Ceramic substrate 5 | Cu | One metal plate having size of 33 × 15 × 0.3 Four metal plates each having size of 7 × 7.5 × 0.3 | | Cu | 35 × 25 × 0.2 |

Concave portions shown in Table 3 were provided in the main metal plate of each of ceramic metal circuit boards 1 to 6. The concave portions were unified to those shown in Table 3. Ceramic metal circuit boards with the concave portions are examples, and those without concave portions are comparative examples. The concave portions were provided only in metal circuit plates each having an area of 100 mm$^2$ or more. The concave portions with an oblong sectional shape were formed by laser machining. The concave portions with a circular sectional shape were formed by etching. In the ceramic metal circuit boards according to the examples, concave portions were provided 3 mm or more inside from the end of the metal plate having an area of 100 mm$^2$ or more. In the ceramic metal circuit boards according to Comparative Examples 1 to 6, no concave portions were provided. In the ceramic metal circuit board according to Comparative Example 7, concave portions were provided only at a portion 1 m inside from the end of the metal plate having an area of 100 mm$^2$ or more. The results are shown in Table 3.

TABLE 3

|  |  | Concave portion | | | | |
|---|---|---|---|---|---|---|
|  | Ceramic metal circuit board | Minimum diameter d (mm) | Depth (mm) | Sectional shape | Shortest distance p (mm) | Area ratio (%) |
| Example 1 | Ceramic metal circuit board 1 | 0.5 | 0.2 | Circular | 2.0 | 30 |
| Example 2 | Ceramic metal circuit board 1 | 2.0 | 0.4 | Oblong | 3.0 | 40 |

TABLE 3-continued

|  | Ceramic metal circuit board | Concave portion | | | | |
|---|---|---|---|---|---|---|
|  |  | Minimum diameter d (mm) | Depth (mm) | Sectional shape | Shortest distance p (mm) | Area ratio (%) |
| Example 3 | Ceramic metal circuit board 2 | 0.8 | 0.4 | Circular | 0.4 | 70 |
| Example 4 | Ceramic metal circuit board 3 | 1.0 | 0.3 | Oblong | 1.0 | 40 |
| Example 5 | Ceramic metal circuit board 3 | 1.4 | 0.3 | Oblong | 2.0 | 35 |
| Example 6 | Ceramic metal circuit board 4 | 1.5 | 0.06 | Oblong | 3.0 | 30 |
| Example 7 | Ceramic metal circuit board 5 | 0.5 | 0.3 | Circular | 1.0 | 60 |
| Example 8 | Ceramic metal circuit board 6 | 0.3 | 0.02 | Oblong | 2.0 | 5 |
| Comparative example 1 | Ceramic metal circuit board 1 |  |  | — |  |  |
| Comparative example 2 | Ceramic metal circuit board 2 |  |  | — |  |  |
| Comparative example 3 | Ceramic metal circuit board 3 |  |  | — |  |  |
| Comparative example 4 | Ceramic metal circuit board 4 |  |  | — |  |  |
| Comparative example 5 | Ceramic metal circuit board 5 |  |  | — |  |  |
| Comparative example 6 | Ceramic metal circuit board 6 |  |  | — |  |  |
| Comparative example 7 | Ceramic metal circuit board 1 | 0.5 | 0.2 | Circular | 5 | 0.3 |

Ceramic metal circuit boards in which the concave portions have a groove shape shown in Table 4 are Examples 9 to 11. In Examples 9 and 10, the concave portions are grooves with an oblong upper surface shape. In Example 11, two continuous grooves each having a rectangular outline shape are provided. The concave portions were unified to those shown in Table 4.

TABLE 4

|  | Ceramic metal circuit board | Concave portion | | | | |
|---|---|---|---|---|---|---|
|  |  | Minimum groove width W = d (mm) | Depth (mm) | Sectional shape | Shortest distance p (mm) | Area ratio (%) |
| Example 9 | Ceramic metal circuit board 1 | 0.6 | 0.5 | Circular | 0.5 | 40 |
| Example 10 | Ceramic metal circuit board 1 | 0.6 | 0.5 | Oblong | 0.8 | 35 |
| Example 11 | Ceramic metal circuit board 3 | 1.0 | 1.0 | Circular | 2 | 60 |

Two semiconductor elements were mounted on a metal circuit plate with concave portions in each of the ceramic metal circuit boards according to the examples and the comparative examples. Next, wire bonding was performed. After that, resin molding was performed by the transfer molding method. Semiconductor devices according to the examples and the comparative examples were thus formed. Additionally, in the semiconductor device according to each example, in the metal circuit plate with the concave portions, a concave portion formation area in a semiconductor element non-mounting region other than both of a semiconductor element mounting portion and a terminal mounting portion was obtained. The results are shown in Table 5.

TABLE 5

|  | Concave portion formation area in semiconductor element non-mounting region other than semiconductor element mounting region |
|---|---|
| Example 1 | 50 |
| Example 2 | 60 |
| Example 3 | 80 |
| Example 4 | 55 |
| Example 5 | 60 |
| Example 6 | 45 |
| Example 7 | 75 |
| Example 8 | 30 |
| Example 9 | 55 |

TABLE 5-continued

|  | Concave portion formation area in semiconductor element non-mounting region other than semiconductor element mounting region |
|---|---|
| Example 10 | 45 |
| Example 11 | 65 |

Next, a resin adhesion strength and a TCT test were performed for the ceramic metal circuit boards according to the examples and the comparative examples. In the resin adhesion strength, the bonding strength of the molding resin on the metal circuit plate with the concave portions was measured by a shear test. Additionally, in the TCT test (heat cycle test), −40° C.×30 min→room temperature (25° C.)×10 min→175° C.×30 min→room temperature (25° C.)×10 min was defined as one cycle, and the presence/absence of peeling of the molding resin after 300 cycles was measured. As for peeling of the molding resin, the peeling area ratio between the resin and the main metal plate that is the metal circuit plate provided with the concave portions was evaluated by ultrasonic inspection (SAT). The peeling area ratio was obtained by peeling area ratio (%)=(area of resin peeling/area of metal circuit plate with concave portions)× 100. The results are shown in Table 6.

Additionally, as Example 12, a ceramic metal circuit board formed by providing concave portions in the ceramic substrate of the ceramic metal circuit board according to Example 1 was prepared. In addition, as Example 13, a ceramic metal circuit board formed by providing non-penetration-type concave portions in the ceramic substrate of the ceramic metal circuit board according to Example 8 was prepared. For the concave portions provided in the ceramic substrates, a diameters d of the concave portions were unified to 1 mm. In addition, the concave portions in each ceramic substrate were formed to be 30% of the area of a portion other than a region where a metal plate was bonded. They were provided outside the ceramic substrate.

TABLE 6

| | Adhesion: shear strength MPa) | Peeling area ratio (%) |
|---|---|---|
| Example 1 | 6 | 0 |
| Example 2 | 7 | 0 |
| Example 3 | 9 | 0 |
| Example 4 | 7 | 0 |
| Example 5 | 7 | 0 |
| Example 6 | 6 | 0 |
| Example 7 | 7 | 0 |
| Example 8 | 4 | 5 |
| Example 9 | 10 | 0 |
| Example 10 | 9 | 0 |
| Example 11 | 9 | 0 |
| Example 12 | 8 | 0 |
| Example 13 | 7 | 2 |
| Comparative Example 1 | 2 | 15 |
| Comparative Example 2 | 2 | 10 |
| Comparative Example 3 | 1 | 12 |
| Comparative Example 4 | 1 | 10 |
| Comparative Example 5 | 1 | 5 |
| Comparative Example 6 | 1 | 8 |
| Comparative Example 7 | 2 | 12 |

As is apparent from the table, for each ceramic metal circuit board with the concave portions, satisfactory results were obtained in both the shear strength and the peeling area. For this reason, the ceramic metal circuit boards according to the examples are suitable for a semiconductor device to be resin-molded.

Additionally, if the concave portions were provided only at the end (1 mm from the end) of the metal circuit plate, as in Comparative Example 7, the adhesion strength to the molding resin was insufficient.

In each of Examples 12 and 13 in which the concave portions were provided in the ceramic substrate, the performance was improved. This shows that providing the concave portions in the ceramic substrate is also effective.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A ceramic metal circuit board formed by bonding metal circuit plates to at least one surface of a ceramic substrate, wherein at least one of the metal circuit plates has an area of not less than 100 mm² and comprises a concave portion having a depth of not less than 0.02 mm within a range of 1% to 70% of a surface of the at least one of the metal circuit plates, and the concave portion is provided not less than 3 mm inside from an end of the at least one of the metal circuit plates, and
wherein a sectional shape of the concave portion is at least one shape selected from a triangular shape or a shape with a convex portion formed at an inlet edge of the concave portion.

2. The ceramic metal circuit board according to claim 1, wherein an area to provide the concave portion falls within a range of 3% to 70% of one metal circuit plate surface.

3. The ceramic metal circuit board according to claim 2, wherein the area to provide the concave portion falls within a range of 30% to 95% of one metal circuit plate surface other than a semiconductor element mounting portion region and a terminal mounting portion region.

4. The ceramic metal circuit board according to claim 1, wherein the depth of the concave portion falls within a range of 10% to 90% of a thickness of the metal circuit plate.

5. The ceramic metal circuit board according to claim 1, wherein an average minimum diameter d (mm) or an average minimum groove width w of the concave portion viewed from an upper side falls within a range of 0.5 mm to 2 mm.

6. The ceramic metal circuit board according to claim 1, wherein an average shortest distance p between concave portions is not less than d/2 (mm) or not less than w/2 (mm).

7. The ceramic metal circuit board according to claim 1, wherein a thickness of the metal circuit plate is not less than 0.3 mm.

8. The ceramic metal circuit board according to claim 1, wherein a surface size of the ceramic substrate is not less than 12 cm².

9. The ceramic metal circuit board according to claim 1, wherein the ceramic metal circuit board has a structure including a back metal plate provided on a side opposite to a surface of the ceramic substrate on which the at least one of the metal circuit plates is provided.

10. The ceramic metal circuit board according to claim 9, wherein the ceramic metal circuit board has a structure including a concave portion provided in the back metal plate.

11. The ceramic metal circuit board according to claim 1, wherein the ceramic substrate comprises a silicon nitride substrate.

12. The ceramic metal circuit board according to claim 1, wherein at least a part of the surface of the ceramic substrate, which excludes a portion where the at least one of the metal circuit plates is provided, comprises a concave portion.

13. A semiconductor device including a semiconductor element provided on a metal circuit plate provided with a concave portion of the ceramic metal circuit board of claim 1 comprises a concave portion.

14. The semiconductor device according to claim 13, wherein semiconductor elements are provided on the at least one of the metal circuit plates provided with the concave portion.

15. The semiconductor device according to claim 13, wherein a junction temperature of the semiconductor element is not less than 170° C.

16. The semiconductor device according to claim 13, wherein the semiconductor device is resin-molded.

* * * * *